United States Patent
Kobayashi et al.

(10) Patent No.: US 7,936,273 B2
(45) Date of Patent: May 3, 2011

(54) RFID TAG MANUFACTURING METHODS AND RFID TAGS

(75) Inventors: Hiroshi Kobayashi, Kawasaki (JP);
Naoki Ishikawa, Kawasaki (JP);
Takayoshi Matsumura, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 979 days.

(21) Appl. No.: 11/606,328

(22) Filed: Nov. 30, 2006

(65) Prior Publication Data

US 2008/0003713 A1    Jan. 3, 2008

(30) Foreign Application Priority Data

Jun. 30, 2006  (JP) ................. 2006-181815

(51) Int. Cl.
*G08B 13/14* (2006.01)
*H01Q 7/00* (2006.01)
*H01Q 1/40* (2006.01)

(52) U.S. Cl. .......... 340/572.7; 343/866; 343/873

(58) Field of Classification Search ........... 343/866, 343/872, 873; 340/572.7
See application file for complete search history.

(56) References Cited

U.S. PATENT DOCUMENTS

| | | | |
|---|---|---|---|
| 6,107,920 A | | 8/2000 | Eberhardt et al. |
| 7,456,506 B2 * | | 11/2008 | Oberle ............. 257/784 |
| 7,500,610 B1 * | | 3/2009 | Hadley et al. ........ 235/451 |
| 2004/0125040 A1 | | 7/2004 | Ferguson et al. |
| 2006/0001138 A1 | | 1/2006 | Sakama et al. |
| 2006/0032926 A1 | | 2/2006 | Baba et al. |
| 2008/0122630 A1 | | 5/2008 | Baba et al. |

FOREIGN PATENT DOCUMENTS

| | | |
|---|---|---|
| CN | 1716694 A | 1/2006 |
| CN | 1734478 A | 2/2006 |
| DE | 199 15 765 | 10/2000 |
| EP | 0 682 321 | 11/1995 |
| EP | 1 626 364 | 2/2006 |
| FR | 2 828 570 | 2/2003 |
| JP | 2000-200332 | 7/2000 |
| JP | 2000-311226 | 11/2000 |
| JP | 2001-351082 | 12/2001 |
| WO | WO 98/08191 | 2/1998 |
| WO | WO 2005/022455 | 3/2005 |

OTHER PUBLICATIONS

Extended European Search Report, mailed Aug. 5, 2008 and issued in corresponding European Patent Application No. 06125049.4-2210.
Chinese Office Action issued Aug. 14, 2009 in corresponding Chinese Patent Application 200610172423.7.

* cited by examiner

Primary Examiner — Shih-Chao Chen
(74) Attorney, Agent, or Firm — Fujitsu Patent Center

(57) ABSTRACT

A method includes a step of preparing a strap having a connecting metal pattern formed on a base, and mounted with the circuit chip, the pattern connecting a circuit chip to a metal antenna pattern. A substrate has a concave section which houses the circuit chip and is formed on a first face. The metal antenna pattern extends over a first face and a second face of the base so as to circle them except for the concave section and to have the both ends positioned across the concave section. The method includes a connection step of positioning and directing the strap and the substrate to house the circuit chip in the concave section and covering the strap and the substrate with a covering material so as to fix the strap and the substrate in a state where the connection metal pattern is connected to the metal antenna pattern.

9 Claims, 11 Drawing Sheets

RFID TAG MANUFACTURING METHODS AND RFID TAGS

CROSS REFERENCE TO RELATED APPLICATIONS

This application claims the benefit under 35 U.S.C. Section 119, of Japanese Patent Application No. 2006-181815, filed Jun. 30, 2006, which is hereby incorporated by reference in its entirety into this application.

BACKGROUND OF THE INVENTION

1. Field of the Invention

The present invention relates to an RFID (Radio_Frequency_IDentification) tag for exchanging information with an external device in a noncontact manner. There are the cases where those in the art refer to the "RFID tag" used herein as an "RFID tag inlay" regarding it as an inlay for the "RFID tag." There are also the cases where the "RFID tag" is referred to as a "Radio Frequency Identification." The "RFID tag" also includes a noncontact IC card.

2. Description of the Related Art

In recent years, there have been proposed various kinds of RFID tags for exchanging information with an external device represented by a reader-writer in a noncontact manner via radio waves. There has been proposed a kind of the RFID tag having a configuration in which an antenna pattern for radio communication and an IC chip are mounted on a base sheet consisting of plastic or paper (see, for example, Japanese Patent Laid-Open No. 2000-311226, Japanese Patent Laid-Open No. 2000-200332, Japanese Patent Laid-Open No. 2001-351082). A conceivable form of use for such a type of the RFID tag is to attach it to an article or the like and exchange the information on the article with the external device to identify the article.

FIG. 1 is a plan view showing an example of the RFID tag.

An RFID tag 1 shown in this FIG. 1 is configured by an antenna 12 provided on a base 13 consisting of a sheet-like PET film and the like and an IC chip 11 electrically connected to the antenna 12 by gold, solder or the like and firmly fixed to the base 13 by an adhesive.

The IC chip 11 configuring the RFID tag 1 can perform radio communication with the external device via the antenna 12 and exchange information.

Here, FIG. 1 shows a looped antenna as the antenna 12 of the RFID tag 1. As for the RFID tags in general, however, the antenna 12 is not limited to this form. It is possible to adopt the antennas in various forms such as the antenna in the form having the IC chip 11 at its center and linearly extending to both sides from the IC chip 11.

The RFID tag as described above may have its communication performance significantly deteriorated by a piece of metal or the like if one exists in proximity thereto. To prevent this, an RFID tag called a metal tag is known. The metal tag is an RFID tag of a structure having a substrate surrounded by a metal pattern operating as the antenna, where the communication performance is maintained even if another piece of metal or the like approaches except for a portion in which the piece of metal becomes a shadow.

Here, a conventional manufacturing method of the metal tag will be described.

FIGS. 2A and 2B are perspective views of parts used for manufacturing of the metal tag.

Here, the IC chip 11 (FIG. 2A) and a substrate 20 for the metal tag (FIG. 2B) are prepared.

As shown in FIG. 2A, the IC chip 11 has a bump 11a of gold or the like formed on its connecting terminal. In FIG. 2A, the IC chip 11 is shown upside down as compared to the IC chip 11 shown in FIG. 1 in order to show a forming face of the bump 11a. The IC chip 11 has a function of performing radio communication with an external device via the antenna (described later) and exchanging information (refer to FIG. 1).

The substrate 20 has a metal antenna pattern 22, which operates as the antenna after assembly, formed on a dielectric plate 21 and surrounding it except for a portion 23 on which the IC chip 11 is to be mounted.

FIGS. 3A, 3B and 3C are process drawings showing an example of the manufacturing method of the metal tag.

Here, a liquid or sheet-like underfill 24 which is a thermosetting adhesive is supplied to the portion 23 of the substrate 20 on which the IC chip 11 is to be mounted (FIG. 3A). The IC chip 11 is put on the portion 23, and the substrate 20 and the IC chip 11 are sandwiched by a heating stage 31 and a heating head 32 to be heated and pressed. Thus, the IC chip 11 and the metal antenna pattern 22 are electrically connected via the bump 11a, and the IC chip 11 is fixed on the substrate 20 as the underfill 24 (FIG. 3B) hardens.

The RFID tag of the structure shown in FIG. 3C is manufactured by undergoing such a process flow. The RFID tag performs radio communication with the external device by means of the IC chip 11 via a loop antenna in the form surrounding and circling front and rear faces of the dielectric plate 21.

This type of the RFID tag is referred to as a so-called metal tag, where the communication performance is sufficiently secured as to the front side of the substrate 20 on which the IC chip 11 is mounted even if another piece of metal approaches the rear side opposite to the front side on which the IC chip 11 is mounted.

However, the RFID tag formed by the manufacturing method described with reference to FIGS. 2 and 3 has the IC chip 11 mounted on the substrate 20 projected from the front face of the substrate 20, which is difficult to render flat and thin. To solve this, it is supposedly possible to render thickness of the substrate 20 thinner. However, a certain distance is required between the substrate front face portion and the substrate rear face portion of the metal antenna pattern 22 in order to secure expected performance of the metal antenna pattern 22 as the loop antenna. Therefore, there is a limit to rendering the substrate 20 thinner from the viewpoint of securing antenna performance.

SUMMARY OF THE INVENTION

The present invention has been made in view of the circumstances, and provides a manufacturing method of an RFID tag rendered thinner and flatter and having performance as a metal tag, and the RFID tag manufactured by the manufacturing method.

The present invention provides a first manufacturing method of an RFID tag as the manufacturing method of an RFID tag including:

a preparation step of preparing a strap and a substrate, the strap having a connecting metal pattern formed on a base, the connecting metal pattern connecting a circuit chip performing radio communication via an antenna after assembly to a metal antenna pattern operating as the antenna after the assembly, the strap mounted with the circuit chip, the substrate having a concave section, which houses the circuit chip, formed on a first face constituting one of top and bottom faces, and the metal antenna pattern having both ends thereof positioned so as to sandwich the concave section, extending to the first face and a second face opposite to the first face and surrounding the first and second faces except for the concave section; and a connection step of positioning and directing the strap and the substrate to house the circuit chip on the strap in the concave section formed on the substrate, fixing the strap and the substrate to each other in a state where the connecting metal pattern on the strap is connected to the metal antenna pattern on the substrate, by covering the strap and the substrate with a covering material.

According to the first manufacturing method of an RFID tag of the present invention, the circuit chip of the strap is housed in the concave section of the substrate so as to render the RFID tag thinner and flatter.

The first manufacturing method of an RFID tag of the present invention is preferably the one wherein the connection step includes:

a provisional connection step of placing the strap on the substrate at a position and in a direction to house the circuit chip on the strap in the concave section formed on the substrate and provisionally connecting the connecting metal pattern on the strap to the metal antenna pattern on the substrate; and a fixing step of covering the strap and the substrate with the covering member with the strap placed on the substrate to fix the strap and the substrate mutually.

Manufacturing time of the RFID tag is shortened by adopting such a preferable connection step so that efficient manufacturing is realized.

Here, the fixing step may be the step of either:

covering the strap and the substrate with the heat softening covering material and attaching the covering member to the strap and the substrate by heating the covering member to fix the strap and the substrate mutually; or covering the strap and the substrate with the covering member having an adhesion layer on its inner face and thereby attaching the covering member to the strap and the substrate to fix the strap and the substrate mutually.

An inexpensive PET and the like can be used as the covering member in the form of heating the covering member to fix the strap and the substrate mutually. Simple and quick fixing work is performed in the form of attaching the covering member having the adhesion layer on its inner face to fix the strap and the substrate mutually.

The provisional connection step may be the step of either:

putting the connecting metal pattern in physical contact with the metal antenna pattern to provisionally connect them; or temporarily joining the connecting metal pattern to the metal antenna pattern to provisionally connect them.

The form of putting them in physical contact is a simple and easy form. The form of temporarily joining them can prevent displacement of the strap from after the provisional connection to before fixation.

Furthermore, it is a preferable form wherein:

the provisional connection step is a step of temporarily joining the connecting metal pattern to the metal antenna pattern with a conductive adhesive to be hardened by heat so as to make a provisional connection; and the fixing step is a step of covering the strap and the substrate with the heat softening covering material and attaching the covering member to the strap and the substrate by heating the covering member and also fixing the strap and the substrate mutually by hardening the adhesive.

According to this preferable form, the temporarily joined portion is hardened by the heat applied in the fixing step so that endurance of the RFID tag is improved and the manufacturing time is reduced.

The first manufacturing method of an RFID tag of the present invention is preferably the one wherein the connection step includes:

a placement step of placing the strap on the adhesion layer of the covering member having the adhesion layer on its inner face when covering; and a fixing step of positioning the substrate against the strap placed on the adhesion layer at the position and in the direction to house the circuit chip on the strap in the concave section formed on the substrate and covering the strap and the substrate with the covering member so as to fix the strap and the substrate mutually.

It is possible, by adopting such a preferable connection step, to avoid the displacement before fixing the strap and the substrate mutually so as to improve accuracy of manufacturing.

The present invention provides a first RFID tag including:

a strap having a connecting metal pattern formed on a base, the connecting metal pattern connecting a circuit chip performing radio communication via an antenna after assembly to a metal antenna pattern operating as the antenna after the assembly, the strap mounted with the circuit chip;

a substrate having a concave section, which houses the circuit chip, formed on a first face constituting one of top and bottom faces, and the metal antenna pattern having both ends thereof positioned so as to sandwich the concave section, extending to the first face and a second face opposite to the first face and surrounding the first and second faces except for the concave section; and a covering member which covers and fixes the strap and the substrate to each other in a state where the strap is placed on the substrate at a position and in a direction to house the circuit chip on the strap in the concave section formed on the substrate and the connecting metal pattern on the strap is in physical contact with the metal antenna pattern on the substrate.

According to the first RFID tag of the present invention, it is a thin and flat RFID tag with the circuit chip of the strap housed in the concave section of the substrate. The strap and the substrate are mutually fixed by covering them with the covering member so as to contribute to reduction in manufacturing time.

The first RFID tag of the present invention is the one wherein the covering member may be either:

softened by heat and attached to the strap and the substrate; or attached to the strap and the substrate by an adhesion layer included on its inner face.

In the case of the covering member softened by heat and attached, a typical covering material such as a PET film is usable. In the case of the covering member attached by the adhesion layer, the process of adhesion is simple enough to contribute to reduction in manufacturing time.

The present invention provides a second manufacturing method of an RFID tag as the manufacturing method of an RFID tag including:

a preparation step of preparing a strap and a substrate, the strap having a connecting metal pattern formed on a base, the connecting metal pattern connecting a circuit chip performing radio communication via an antenna after assembly to a metal antenna pattern operating as the antenna after the assembly, the strap mounted with the circuit chip, the substrate having a concave section, which houses the circuit chip, formed on a first face constituting one of top and bottom faces, and the metal antenna pattern having both ends thereof positioned so as to sandwich the concave section, extending to the first face and a second face opposite to the first face and surrounding the first and second faces except for the concave section; and a connection step of connecting metal pattern on the strap to the metal antenna pattern on the substrate, by placing the strap on the substrate at a position and in a direction to house the circuit chip on the strap in the concave section formed on the substrate and applying ultrasound to the strap.

According to the second manufacturing method of an RFID tag of the present invention, the circuit chip of the strap is housed in the concave section of the substrate so as to render the RFID tag thinner and flatter. The manufacturing time is short because the connection by the ultrasound is adopted.

The present invention provides a second RFID tag as the RFID tag including:

a strap having a connecting metal pattern formed on a base, the connecting metal pattern connecting a circuit chip performing radio communication via an antenna after assembly to a metal antenna pattern operating as the antenna after the assembly, the strap mounted with the circuit chip; and a substrate having a concave section, which houses the circuit chip, formed on a first face constituting one of top and bottom faces, and the metal antenna pattern having both ends thereof positioned so as to sandwich the concave section, extending to the first face and a second face opposite to the first face and surrounding the first and second faces except for the concave section, wherein the strap has ultrasound applied thereto by being placed on the substrate at a position and in a direction to house the circuit chip on the strap in the concave section formed on the substrate, and the connecting metal pattern on the strap is thereby connected to the metal antenna pattern on the substrate.

According to the second RFID tag of the present invention, it is a thin and flat RFID tag with the circuit chip of the strap housed in the concave section of the substrate. The manufacturing time is short because the connection by the ultrasound is adopted.

The present invention provides a third manufacturing method of an RFID tag as the manufacturing method of an RFID tag including:

a preparation step of preparing a strap and a substrate, the strap having a connecting metal pattern formed on a base, the connecting metal pattern connecting a circuit chip performing radio communication via an antenna after assembly to a metal antenna pattern operating as the antenna after the assembly, the strap mounted with the circuit chip, the substrate having a concave section, which houses the circuit chip, formed on a first face constituting one of top and bottom faces, and the metal antenna pattern having both ends thereof positioned so as to sandwich the concave section, extending to the first face and a second face opposite to the first face and surrounding the first and second faces except for the concave section; and a connection step of connecting the connecting metal pattern on the strap to the metal antenna pattern on the substrate by placing and pinning the strap on the substrate at a position and in a direction to house the circuit chip on the strap in the concave section formed on the substrate.

According to the third manufacturing method of an RFID tag of the present invention, the RFID tag is rendered thinner and flatter by housing the circuit chip of the strap in the concave section of the substrate. The manufacturing time is short because the connection by pinning is adopted.

The present invention provides a third RFID tag as the RFID tag including:

a strap having a connecting metal pattern formed on a base, the connecting metal pattern connecting a circuit chip performing radio communication via an antenna after assembly to a metal antenna pattern operating as the antenna after the assembly, the strap mounted with the circuit chip; and a substrate having a concave section, which houses the circuit chip, formed on a first face constituting one of top and bottom faces, and the metal antenna pattern having both ends thereof positioned so as to sandwich the concave section, extending to the first face and a second face opposite to the first face and surrounding the first and second faces except for the concave section, wherein the strap is placed and pinned on the substrate at a position and in a direction to house the circuit chip on the strap in the concave section formed on the substrate, and thereby the connecting metal pattern on the strap is connected to the metal antenna pattern on the substrate.

According to the third RFID tag of the present invention, it is a thin and flat RFID tag with the circuit chip of the strap housed in the concave section of the substrate. The manufacturing time is short because the connection by pinning is adopted.

As described above, it is possible to obtain the RFID tag rendered thinner and flatter according to the present invention.

BRIEF DESCRIPTION OF THE DRAWINGS

FIGS. 5A-1 through 5E-1 are process drawings showing a manufacturing method of a strap;

DETAILED DESCRIPTION OF THE INVENTION

Embodiments of the present invention will be described hereunder with reference to the drawings.

Figure 4A:
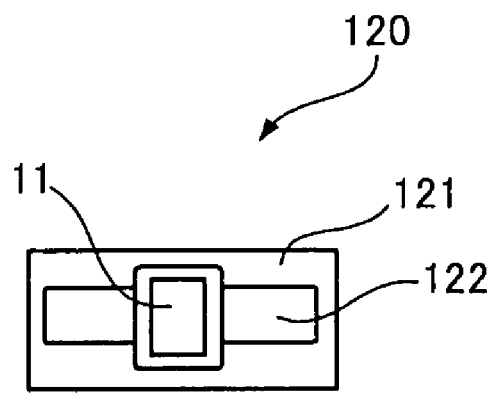
FIGS. 4A and 4B are perspective views showing the parts used in common in the manufacturing methods.
Figure 4B:
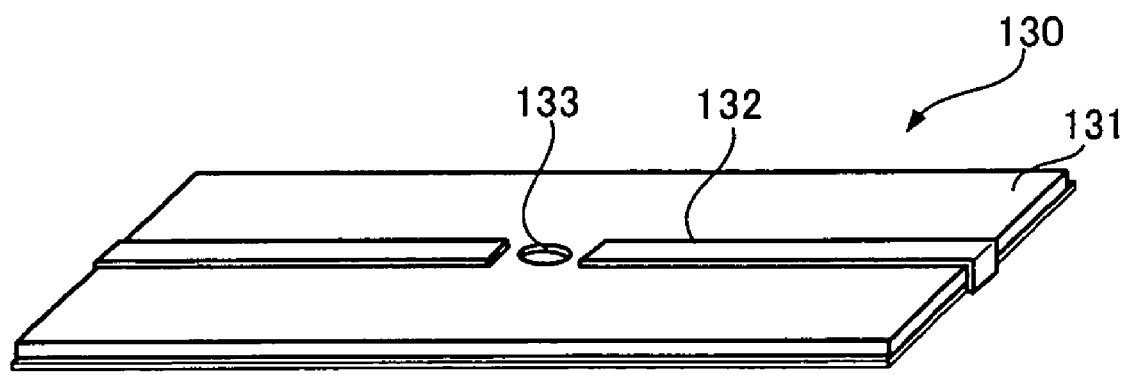

FIGS. 4A and 4B are perspective views showing parts used in common in manufacturing methods described hereunder.

A strap 120 shown in FIG. 4A and a substrate 130 shown in FIG. 4B are prepared in the embodiments described hereunder.

The strap 120 of FIG. 4A has a connecting metal pattern 122 formed on a base 121 of a PET film or the like, and further has an IC chip 11 electrically connected to the connecting metal pattern 122 mounted thereon. The IC chip 11 has a gold bumps formed thereon as with the IC chip shown in FIG. 2A, and has a function of performing radio communication with outside via an antenna described later (refer to FIG. 1).

A substrate 130 of FIG. 4B has a metal antenna pattern 132 formed on a dielectric plate 131 having a concave section 133 for housing the IC chip 11 formed thereon, the metal antenna pattern 132 circling front and rear faces except for the concave section 133.

Next, a manufacturing method of the strap 120 shown in FIG. 4A will be described.

Figure 1:
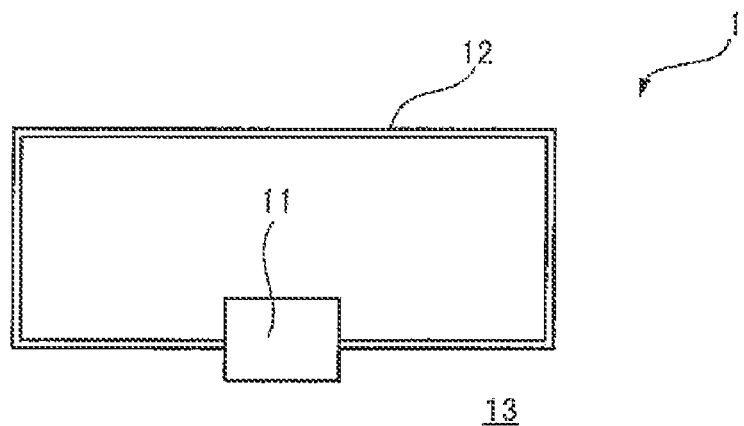
FIG. 1 is a plan view showing an example of an RFID tag.
Figure 2A:
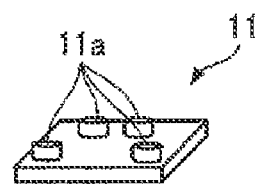
FIGS. 2A and 2B are perspective views of parts used for manufacturing of a metal tag.
Figure 2B:
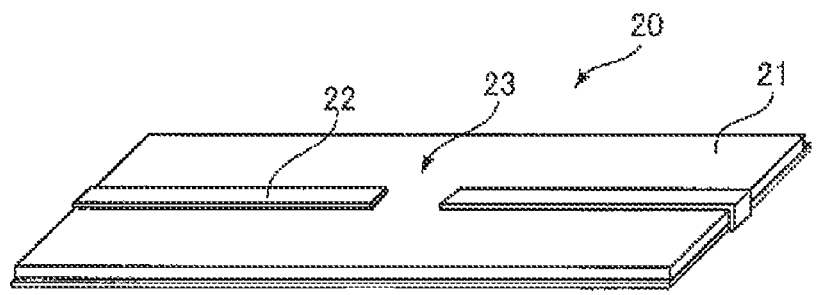
Figure 3A:
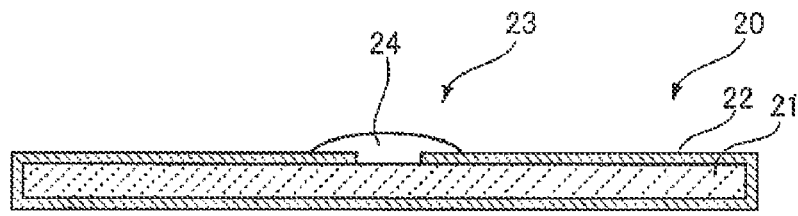
FIGS. 3A, 3B and 3C are process drawings showing an example of the manufacturing method of a metal tag.
Figure 3B:
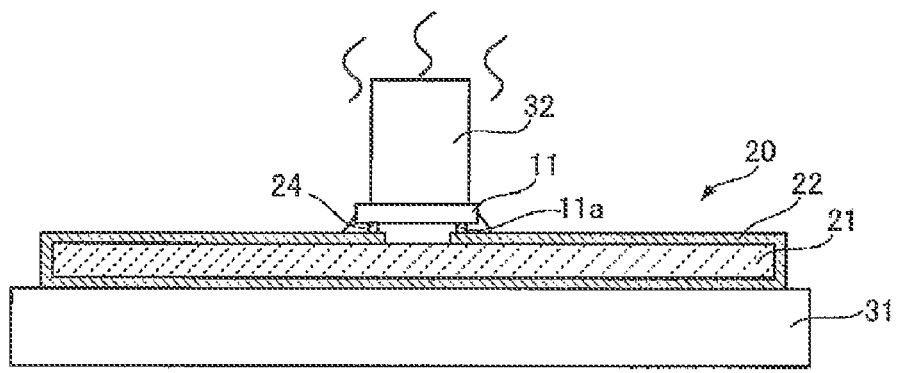
Figure 3C:
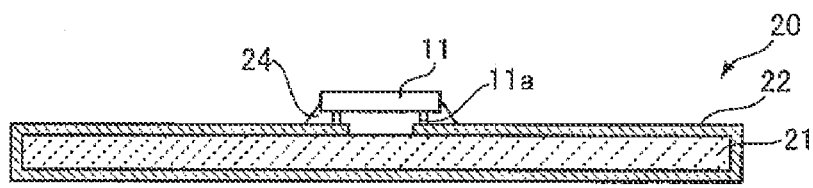
Figures 1, 5A:
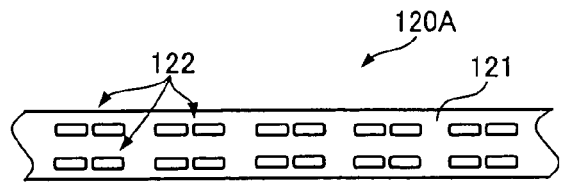
Figures 2, 5A:
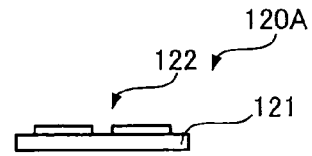
Figures 1, 5B:
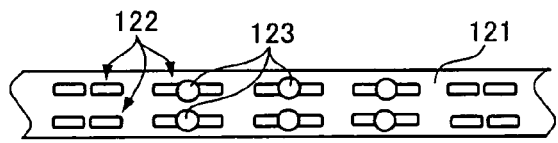
Figures 2, 5B:
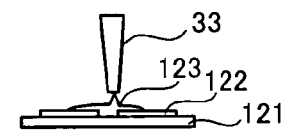
Figures 1, 5C:
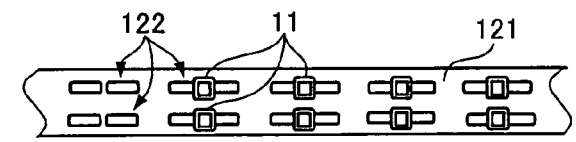
Figures 2, 5C:
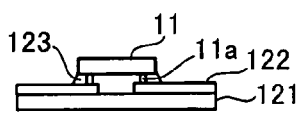
Figures 1, 5D:
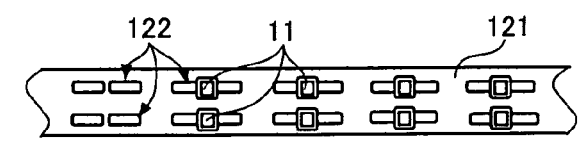
Figures 2, 5D:
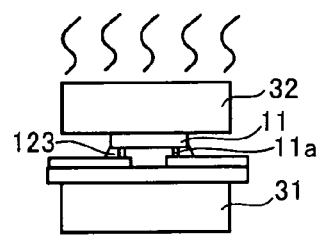
Figures 1, 5E:
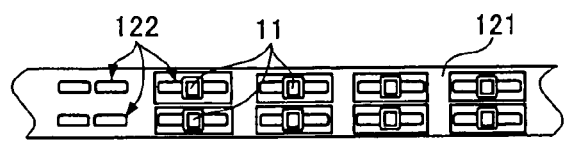

FIGS. 5A-1 through 5E-1 are process drawings showing the manufacturing method of the strap.

Here, a long strap sheet 120A is prepared first.

As shown in FIG. 5A-1, the strap sheet 120A has multiple connecting metal patterns 122 formed on the long base 121 consisting of the PET film or the like. FIG. 5A-2 is a sectional view of a portion of the strap sheet 120A equivalent to one connecting metal pattern.

The connecting metal pattern 122 is divided into two pieces, and an IC chip is mounted at the center thereof.

Next, a liquid or sheet-like underfill 123 which is a thermosetting adhesive is supplied to an IC chip mounting position of each of the connecting metal patterns 122 formed on the strap sheet 120A (refer to FIGS. 5B-1 and 5B-2). Here, the liquid underfill 123 is dropped by using a nozzle 33 as shown in FIG. 5B-2.

Next, the IC chip 11 is mounted over where the liquid underfill 123 was applied (refer to FIGS. 5C-1 and 5C-2), and is sandwiched between a heating stage 31 and a heating head 32 (refer to FIGS. 5D-1 and 5D-2) to be heated and pressed by the heating stage 31 and the heating head 32. Thus, the IC chip 11 is electrically connected to the connecting metal pattern 122 via the bumps 11a, and the IC chip 11 is fixed on the strap sheet 120A as the underfill 123 hardens.

Furthermore, the strap sheet 120A is rendered as a piece of the strap 120 (refer to FIG. 4A) including one IC chip and one connecting metal pattern 122 by punching, cutting or the like.

Next, a description will be given as to a manufacturing method of an RFID tag using the strap 120 shown in FIG. 4A thus manufactured and the substrate 130 manufactured separately therefrom shown in FIG. 4B. Preparations for the strap 120 and the substrate 130 described in FIG. 4 are equivalent to an example of the preparation step according to the present invention, and so a description of the preparation step will be omitted in the following.

FIGS. 6A through 6D are process drawings showing a first manufacturing method of an RFID tag.

Figure 6A:
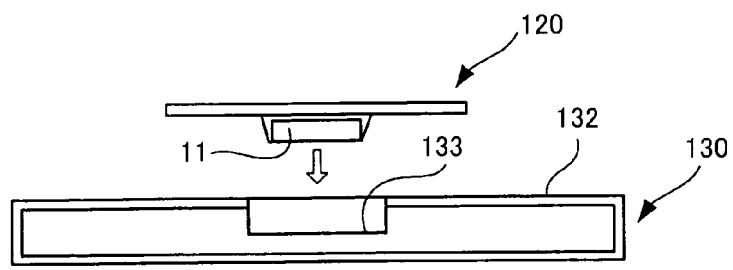
FIGS. 6A through FIG. 6D are process drawings showing a first manufacturing method of an RFID tag.
Figure 6B:
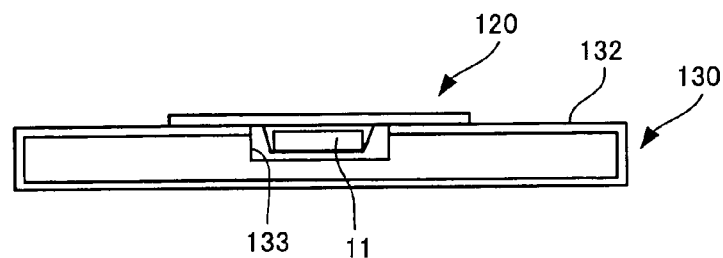

According to the first manufacturing method, the metal antenna pattern 132 and the concave section 133 on the substrate 130 are aligned with the IC chip 11 on the strap 120 (FIG. 6A) in order to place the strap 120 on the substrate 130 (FIG. 6B). In this case, the connecting metal pattern 122 on the strap 120 (refer to FIG. 4) makes a physical contact with the metal antenna pattern 132 on the substrate 130 in a state where the IC chip 11 is housed in the concave section 133 of the substrate 130 so as to realize a provisional electric connection.

Figure 6C:
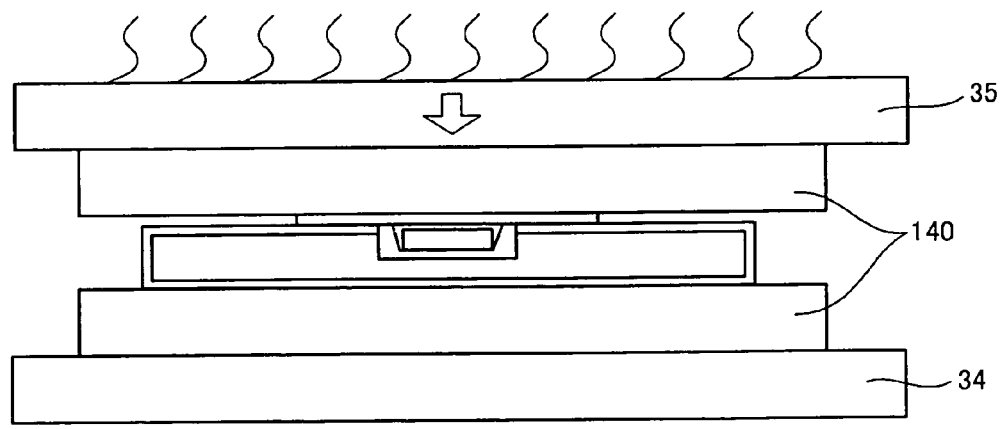
Figure 6D:
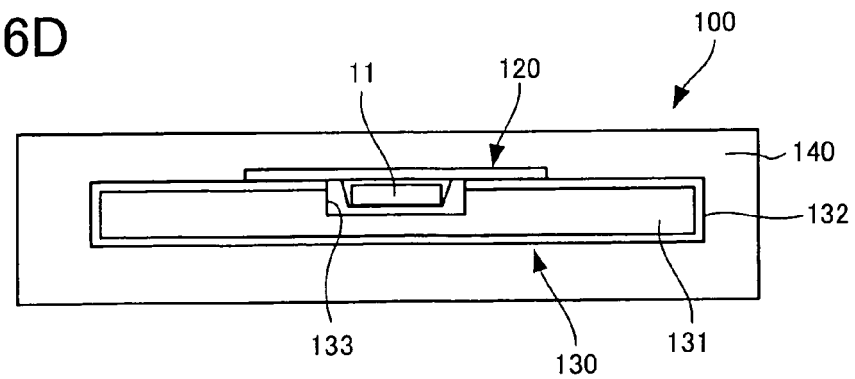

Next, the strap 120 and the substrate 130 in the state shown in FIG. 6B are sandwiched by covering sheets 140 consisting of a PET film or the like, and are sandwiched to be heated and pressed by the heating stage 34 and the heating head 35 (refer to FIG. 6C). The covering sheets 140 are thereby softened to cover and fix the strap 120 and the substrate 130 to each other (FIG. 6D).

An RFID tag 100 thus manufactured has a loop antenna formed thereon in the form of surrounding and circling front and rear faces of the dielectric plate 131 by the connecting metal pattern 122 on the strap 120 (refer to FIG. 4) and the metal antenna pattern 132 on the substrate 130. The IC chip 11 performs radio communication with an external device via the loop antenna. The RFID tag 100 thus manufactured has the IC chip 11 housed in the concave section 133 provided on the substrate 130 so as to be rendered thinner and flatter.

The first manufacturing method described above is a simple and low-cost manufacturing method since it adopts the method of simply placing the strap 120 on the substrate 130 as shown in FIG. 6B as an example of the provisional connection step according to the present invention.

Next, a second manufacturing method of an RFID tag will be described.

Figure 7A:
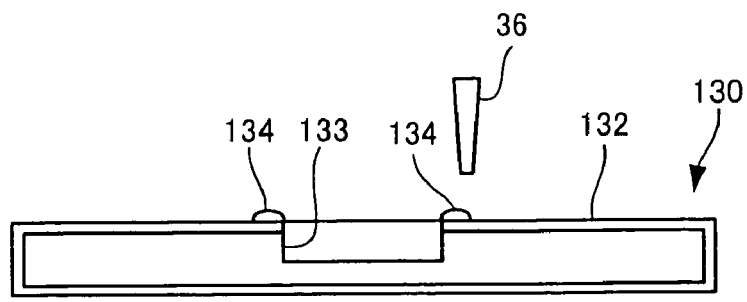
FIGS. 7A, 7B and 7C are process drawings showing a first half of a second manufacturing method of an RFID tag.
Figure 7B:
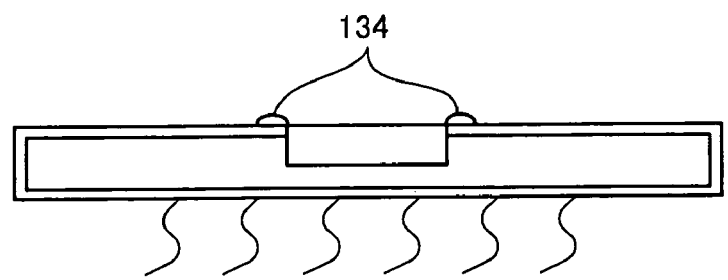
Figure 7C:
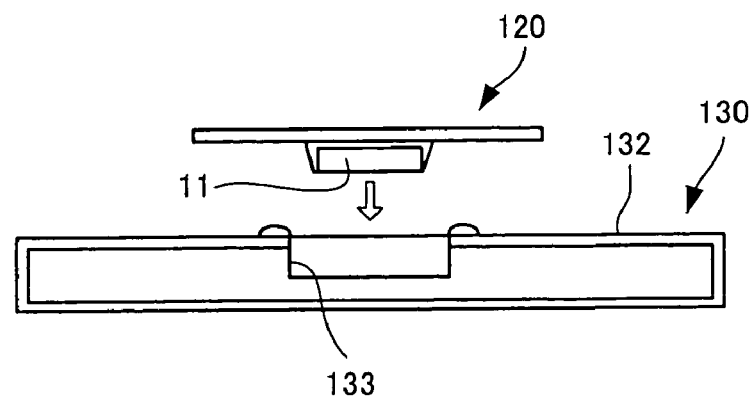
Figure 8A:
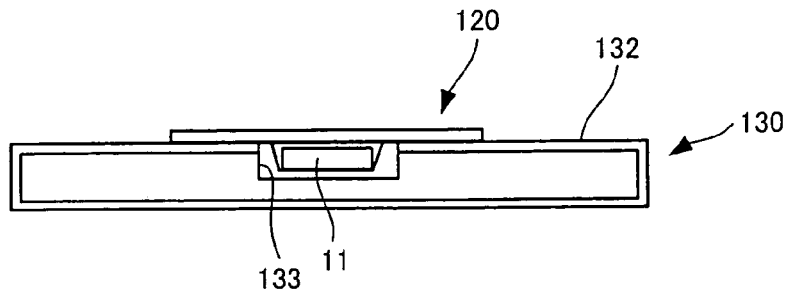
FIGS. 8A, 8B and 8C are process drawings showing a second half of the second manufacturing method of an RFID tag.
Figure 8B:
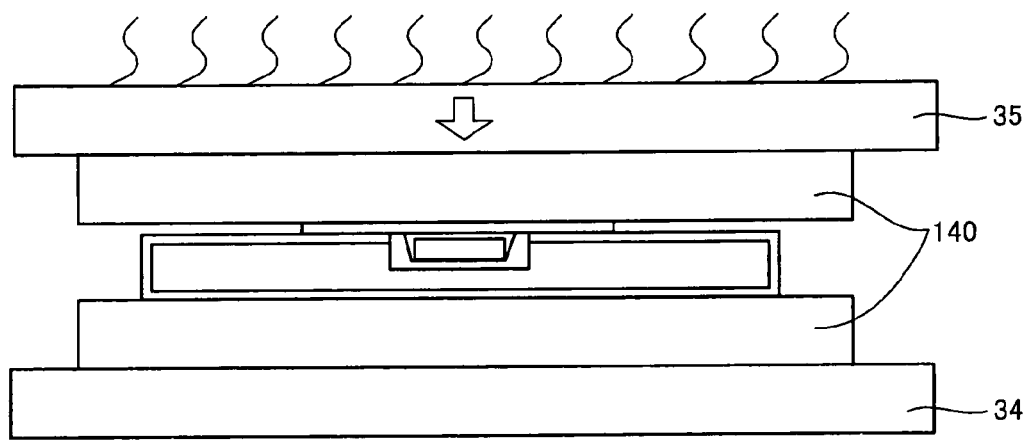
Figure 8C:
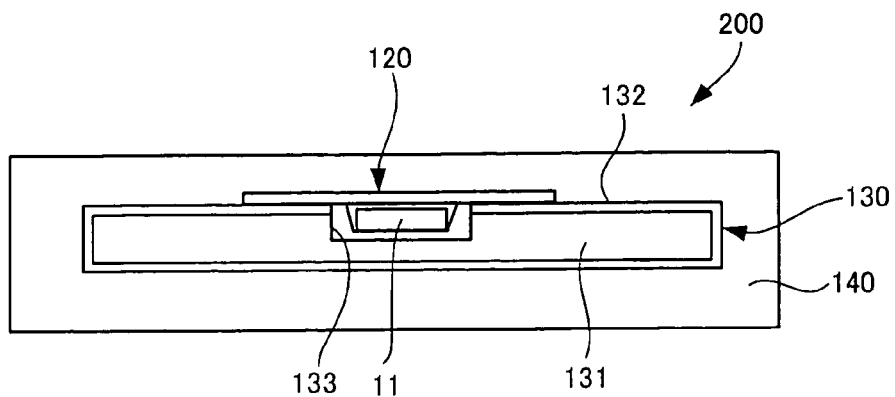

FIGS. 7A through 7C are process drawings showing a first half of the second manufacturing method of an RFID tag. FIGS. 8A through 8C are process drawings showing a second half of the second manufacturing method of an RFID tag.

According to the second manufacturing method, first, a thermosetting silver paste 134 which is a kind of a conductive adhesive is supplied to the both ends of the metal antenna pattern 132 across the concave section 133 on the substrate 130 by a nozzle 36 of a dispenser (FIG. 7A). It is possible, instead of supplying the silver paste with the nozzle 36, to print the silver paste on those portions.

Next, the silver paste 134 is semi-hardened by heating it for a short time (FIG. 7B), and the metal antenna pattern 132 and the concave section 133 on the substrate 130 are aligned with the IC chip 11 on the strap 120 (FIG. 7C) to place the strap 120 on the substrate 130 (FIG. 8A). Thus, in the state where the IC chip 11 is housed in the concave section 133 of the substrate 130, the connecting metal pattern 122 on the strap 120 (refer to FIGS. 4A and 4B) and the metal antenna pattern 132 on the substrate 130 are temporarily joined to be provisionally connected electrically, and the strap 120 is temporarily fixed on the substrate 130.

Next, the strap 120 and the substrate 130 in the state shown in FIG. 8A are sandwiched by covering sheets 140 consisting of the PET film or the like, and are heated and pressed by the heating stage 34 and heating head 35, being sandwiched therebetween (refer to FIG. 8B). The covering sheets 140 are thereby softened to cover the strap 120 and the substrate 130, and the semi-hardened silver paste becomes completely hardened to fix the strap 120 and the substrate 130 mutually (FIG. 8C).

An RFID tag 200 thus manufactured has a loop antenna formed thereon in the form of surrounding and circling the front and rear faces of the dielectric plate 131 by the connecting metal pattern 122 on the strap 120 (refer to FIGS. 4A and 4B) and the metal antenna pattern 132 on the substrate 130. The IC chip 11 performs radio communication with an external device via the loop antenna. The RFID tag 200 also has the IC chip 11 housed in the concave section 133 provided on the substrate 130 so as to be rendered thinner and flatter. Furthermore, the RFID tag 200 has the strap 120 connected to the substrate 130 by the silver paste, and so it is more durable than the RFID tag 100 shown in FIG. 6D.

The second manufacturing method described above adopts a method of provisionally fixing the strap 120 on the substrate 130 with the semi-hardened silver paste as shown in FIGS. 7C and 8A as an example of the provisional connection step according to the present invention. Therefore, the method avoids a possibility of displacement before the strap 120 is finally and completely fixed on the substrate 130 so that accuracy in manufacturing is high. The heating in the step of FIG. 8B realizes both the covering with the covering sheets 140 and hardening of the silver paste, so that manufacturing time is reduced.

Next, a third manufacturing method of an RFID tag will be described. The third manufacturing method undergoes the same steps as the first manufacturing method of an RFID tag up to the step of FIG. 6B. Therefore, the subsequent steps after the step of FIG. 6B will be described.

Figure 9A:
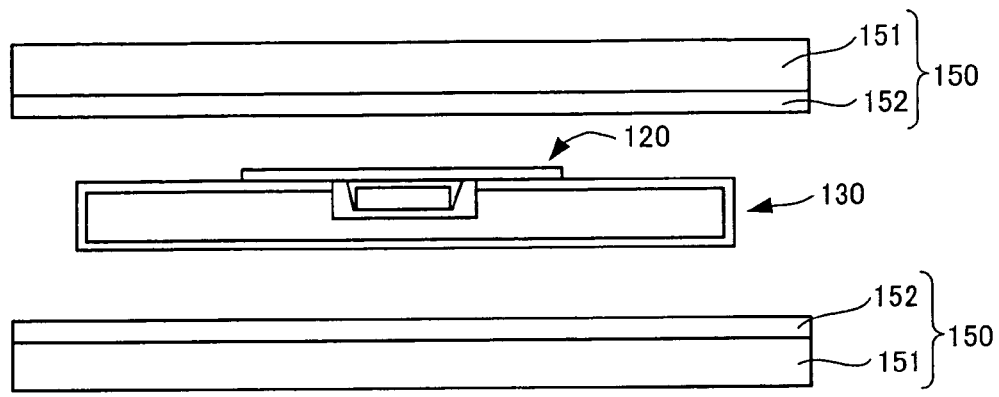
FIGS. 9A, 9B and 9C are process drawings showing a third manufacturing method of an RFID tag.
Figure 9B:
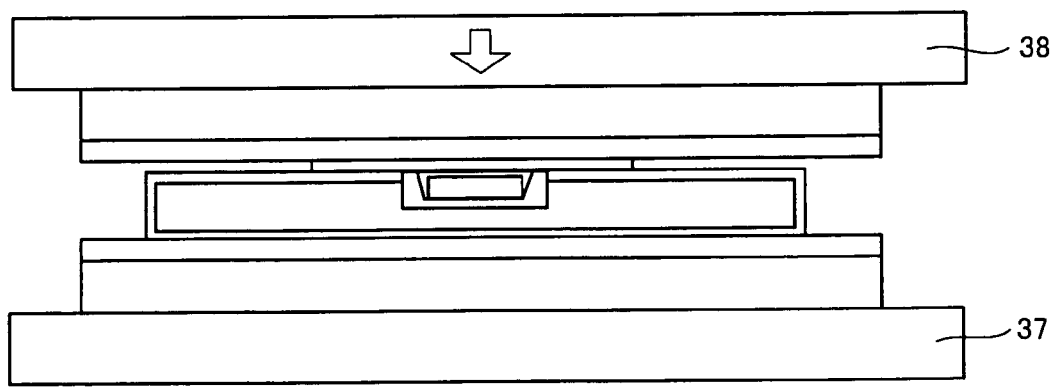
Figure 9C:
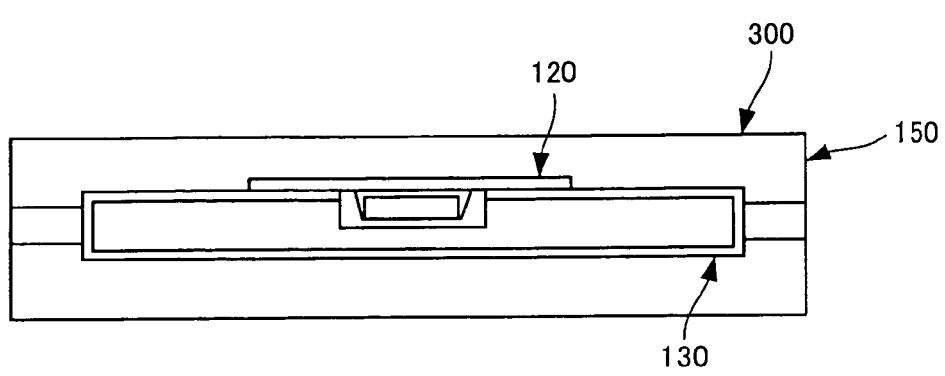

FIGS. 9A through 9C are process drawings showing the third manufacturing method of an RFID tag.

According to the third manufacturing method, the strap 120 and the substrate 130 in the state shown in FIG. 6B are sandwiched by covering sheets 150 consisting of a sheet base member 151 such as a PET film and an adhesive layer 152 (FIG. 9A), and are pressed by being sandwich between a pressing stage 37 and a pressing head 38 (refer to FIG. 9B). The covering sheets 150 are thereby attached to the strap 120 and the substrate 130 to be fixed mutually and cover the strap 120 and the substrate 130 (FIG. 9C).

An RFID tag 300 thus manufactured is rendered thinner and flatter as with the RFID tag 100 shown in FIG. 6D.

The third manufacturing method described above is a low-cost and short-time manufacturing method which requires no heating since it adopts the method of attaching the covering sheets 150 including the adhesive layer 152 to the strap 120 and the substrate 130 to be fixed mutually as an example of the fixing step according to the present invention.

Next, a fourth manufacturing method of an RFID tag will be described. The fourth manufacturing method is a manufacturing method for manufacturing the same RFID tag as the RFID tag 300 shown in FIG. 9C.

FIGS. 10A through 10E are process drawings showing the fourth manufacturing method of an RFID tag.

Figure 10A:
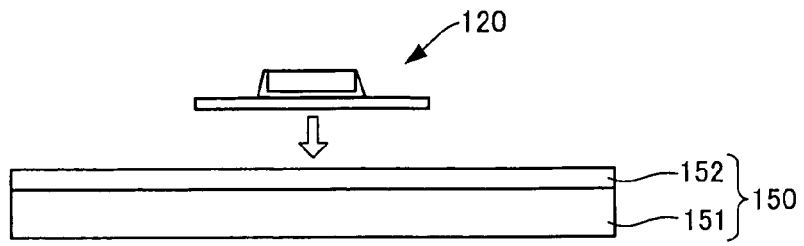
FIGS. 10A through 10E are process drawings showing a fourth manufacturing method of an RFID tag.
Figure 10B:
Figure 10C:
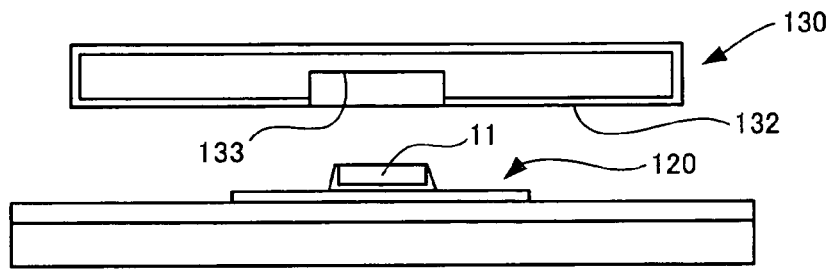
Figure 10D:
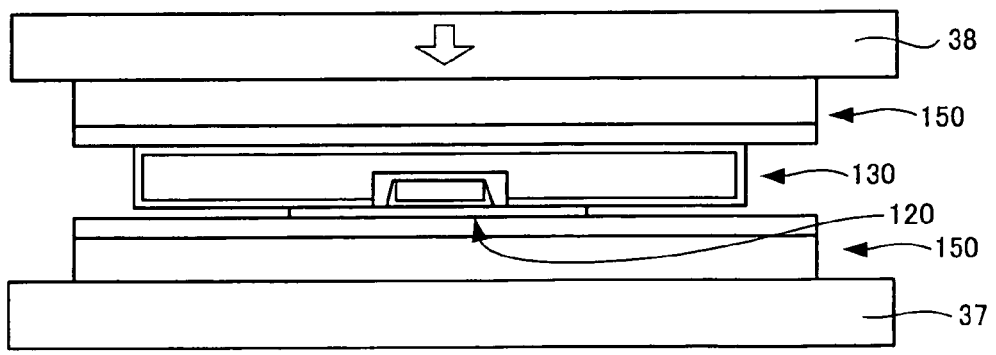
Figure 10E:
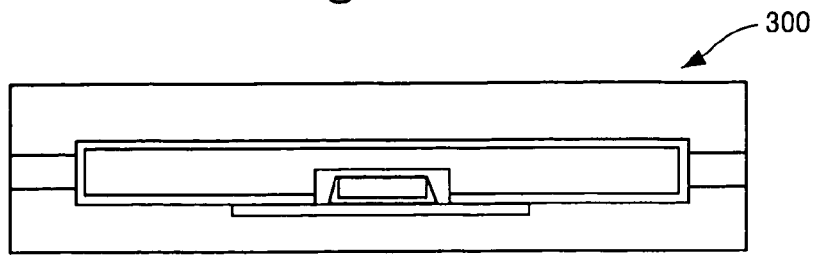

According to the fourth manufacturing method, the strap 120 is placed and attached on the adhesive layer 152 of the covering sheets 150 consisting of the sheet base member 151 such as the PET film and adhesive layer 152 (FIGS. 10A and 10B). Next, the metal antenna pattern 132 and the concave section 133 on the substrate 130 are aligned with the IC chip 11 on the strap 120 (FIG. 10C) to place the substrate 130 on the strap 120. The strap 120 and the substrate 130 are sandwiched by the covering sheets 150, and are pressed by being sandwiched between the pressing stage 37 and pressing head 38 (refer to FIG. 10D). Thus, the same RFID tag 300 as the RFID tag 300 shown in FIG. 9C is manufactured.

Next, a fifth manufacturing method of an RFID tag will be described. The fifth manufacturing method undergoes the same steps as the first manufacturing method of an RFID tag up to the step of FIG. 6B. Therefore, the following will describe the steps thereafter.

FIGS. 11A through 11E are process drawings showing the fifth manufacturing method of an RFID tag.

Figure 11A:
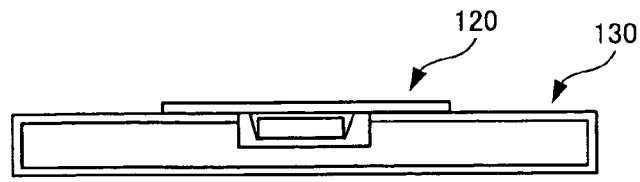
FIGS. 11A through 11E are process drawings showing a fifth manufacturing method of an RFID tag.
Figure 11B:
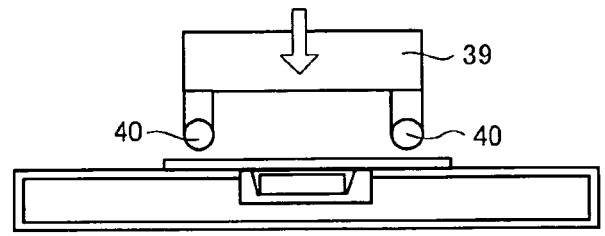
Figure 11C:
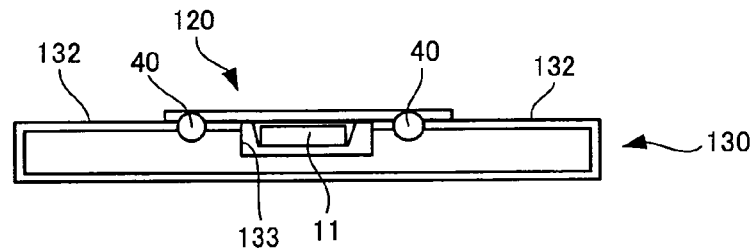

According to the fifth manufacturing method, pins 40 are pushed from the strap 120 side into the strap 120 and the substrate 130 (FIG. 11A) in the same state as the state shown in FIG. 6B by a pinhead 39 (FIG. 11B) so that the strap 120 and the substrate 130 are fixed to each other (FIG. 11C). Accordingly, the connecting metal pattern 122 on the strap 120 (refer to FIG. 4) and the metal antenna pattern 132 on the substrate 130 are put in physical contact and fixed by the pins 40 in the state where the IC chip 11 is housed in the concave section 133 of the substrate 130 so as to realize an electric connection.

Figure 11D:
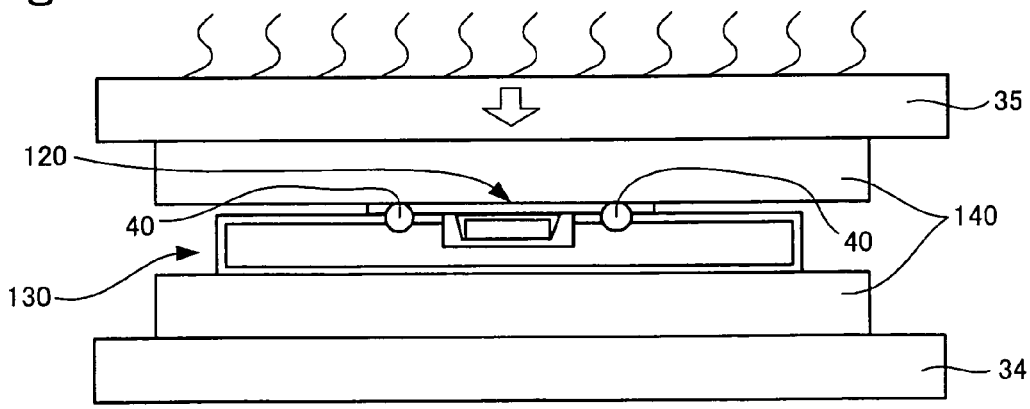
Figure 11E:
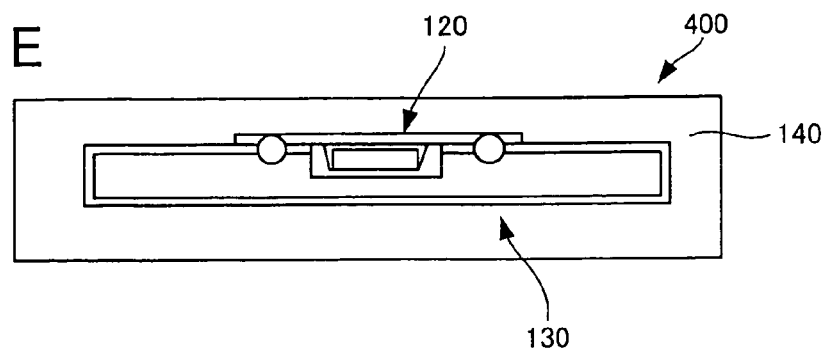

Next, the strap 120 and the substrate 130 thus fixed to each other by the pins 40 are sandwiched by the covering sheets 140 consisting of the PET film or the like, and are heated and pressed by being sandwiched between the heating stage 34 and the heating head 35 (refer to FIG. 11D). The covering sheets 140 are thereby softened to cover the strap 120 and the substrate 130, so that an RFID tag 400 is obtained.

The strap 120 and the substrate 130 are completely fixed to each other by the steps up to FIG. 11C, and so the step of FIG. 11D is omissible. However, from the viewpoint of improving durability and the like, it is desirable to adopt the step of FIG. 11D and cover the strap 120 and the substrate 130 with the covering sheets 140.

The RFID tag 400 thus manufactured has the IC chip 11 housed in the concave section 133 provided on the substrate 130 that is rendered thinner and flatter.

The fifth manufacturing method described above is a short-time manufacturing method of a small number of steps because the strap 120 and the substrate 130 are fixed to each other by the pins.

Lastly, a sixth manufacturing method of the RFID tag will be described. The sixth manufacturing method is performed through the same steps as the first manufacturing method of the RFID tag up to the step of FIG. 6B. Therefore, the subsequent steps after the step shown in FIG. 6B will be described.

Figure 12A:
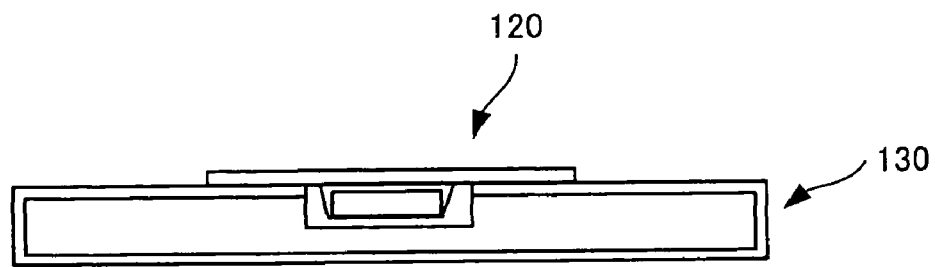
FIGS. 12A through 12C are process drawings showing a sixth manufacturing method of an RFID tag.
Figure 12B:
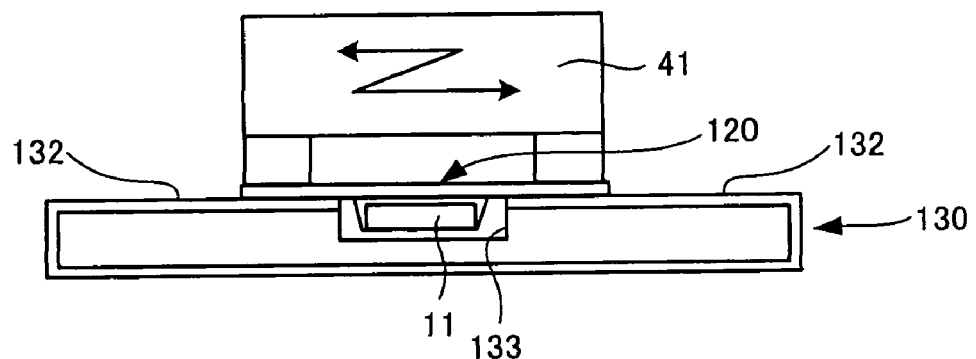
Figure 12C:
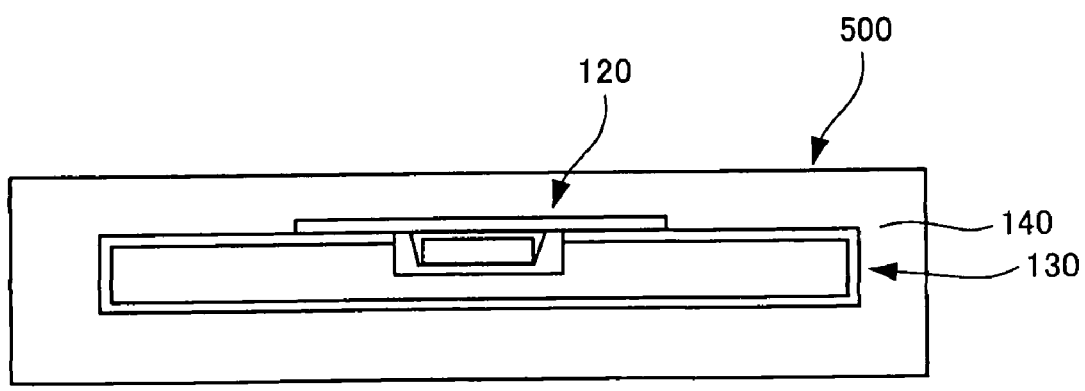

FIGS. 12A through 12C are process drawings showing the sixth manufacturing method of an RFID tag.

According to the sixth manufacturing method, an ultrasonic vibration in a lateral direction of the drawing is applied from the strap 120 side to the strap 120 and the substrate 130 (FIG. 12A) in the same state as the state shown in FIG. 6B by an ultrasonic head 41 (FIG. 12B). A tip of the ultrasonic head 41 is sticking to and holding the strap 120. As the ultrasonic vibration is applied, surfaces of both the connecting metal pattern 122 on the strap 120 (refer to FIG. 4) and the metal antenna pattern 132 on the substrate 130 are vibrated to rub each other and melted instantaneously in the state where the IC chip 11 is housed in the concave section 133 of the substrate 130. If application of the ultrasonic vibration is stopped thereafter, the melted surfaces are firmly fixed to each other to be electrically connected, and the strap 120 and the substrate 130 are fixed to each other.

Thereafter, the strap 120 and the substrate 130 are covered by the covering sheets 140 in the same step as the step of FIG. 11D so that an RFID tag 500 is obtained (FIG. 12C).

The strap 120 and the substrate 130 are completely fixed to each other through the steps up to FIG. 12B, and so the covering by the covering sheets 140 is also omissible in the sixth manufacturing method. From the viewpoint of improving durability and the like, however, it is desirable to cover the strap 120 and the substrate 130 with the covering sheets 140.

The RFID tag 500 thus manufactured also has the IC chip 11 housed in the concave section 133 provided on the substrate 130, so that the RFID tag 500 is thinned and flattened.

The sixth manufacturing method described above is a short-time manufacturing method of a small number of steps because the strap 120 and the substrate 130 are fixed to each other by the ultrasonic vibration.

In the description above, the silver paste is used as an example of the conductive adhesive according to the present invention. However, the conductive adhesive according to the present invention may be other than the silver paste as long as the conductive adhesive is a thermosetting-type conductive adhesive.

In the description above, the covering sheets consisting of the PET film or the like is used as an example of the covering member according to the present invention. However, the covering member according to the present invention may be any material capable of covering and mutually fixing the strap and the substrate, for example, one which is a liquid before the covering. The covering member according to the present invention may also be the one having a cylindrical external form covering the strap and the substrate as a derivative one that is a little different from the object of the invention in terms of thinning.

In the description above, the example of adopting the silver paste which finally hardens completely is shown as an agent for temporarily joining the connecting metal pattern to the metal antenna pattern. However, according to the present invention, it is possible to adopt an adhesive working for the temporarily joining, which leaves final fixing to the covering member or the like without contributing to the final fixing.

What is claimed is:

1. An RFID tag manufacturing method comprising:
   providing a substrate including a dielectric plate, a concave section formed on the dielectric plate, and an antenna pattern formed on the dielectric plate except for the concave section;
   providing a strap including a base, a metal pattern formed on the base and including a portion to extend outside the concave section and to be coupled to the antenna pattern, and a circuit chip mounted on the metal pattern;
   placing the circuit chip within the concave section, and coupling the portion of the metal pattern of the strap to the antenna pattern of the substrate outside the concave section.

2. The RFID tag manufacturing method according to claim 1, further comprising:
   interposing the strap and the substrate between two cover sheets after placing the circuit chip within the concave section and after positioning the metal pattern of the strap to the antenna pattern of the substrate; and
   heating the two cover sheets under pressure to fix the metal pattern of the strap to the antenna pattern of the substrate outside the concave section.

3. The RFID tag manufacturing method according to claim 2, wherein the two cover sheets are formed of a thermo-softening material.

4. The RFID tag manufacturing method according to claim 2, wherein
   the metal pattern of the strap is provisionally coupled to the antenna pattern of the substrate with a thermosetting conductive adhesive; and
   the two cover sheets are heated under pressure to cure the thermosetting conductive adhesive.

5. The RFID tag manufacturing method according to claim 1, wherein the circuit chip includes a bump connected to the metal pattern of the strap, and the bump of the circuit chip is opposed to the concave section of the substrate.

6. An RFID tag comprising:
   a strap including a base, a metal pattern formed on the base, and a circuit chip mounted on the metal pattern; and
   a substrate including a dielectric plate, a concave section formed on the dielectric plate, and an antenna pattern formed on the dielectric plate except for the concave section; wherein
   the circuit chip is placed within the concave section, and
   the metal pattern of the strap includes a portion which extends outside the concave section and which is coupled to the antenna pattern of the substrate outside the concave section.

7. The RFID tag according to claim 6, wherein the circuit chip includes a bump connected to the metal pattern of the strap, and the bump of the circuit chip is opposed to the concave section of the substrate.

8. The RFID tag according to claim 6, wherein the metal pattern of the strap is coupled to the antenna pattern of the substrate with a thermosetting conductive adhesive.

9. The RFID tag according to claim 6, wherein the strap has a dimension greater than the concave section.

* * * * *